(12) United States Patent
Fukuta et al.

(10) Patent No.: US 7,271,860 B2
(45) Date of Patent: Sep. 18, 2007

(54) SEMICONDUCTOR DEVICE, LIQUID CRYSTAL MODULE ADOPTING SAME, METHOD OF MANUFACTURING LIQUID CRYSTAL MODULE, AND ELECTRONIC EQUIPMENT ADOPTING SAME

(75) Inventors: Kazuhiko Fukuta, Nara (JP); Tomohiko Iwane, Nara (JP); Masahiko Monzen, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/929,432

(22) Filed: Aug. 31, 2004

(65) Prior Publication Data

US 2005/0024553 A1    Feb. 3, 2005

Related U.S. Application Data

(62) Division of application No. 09/932,026, filed on Aug. 20, 2001, now Pat. No. 6,903,794.

(30) Foreign Application Priority Data

Aug. 28, 2000   (JP) .............................. 2000-258068

(51) Int. Cl.
   *G02F 1/1333* (2006.01)
(52) U.S. Cl. ........................................ 349/58; 349/150
(58) Field of Classification Search ................ 349/58, 349/150, 151, 152
   See application file for complete search history.

(56) References Cited

U.S. PATENT DOCUMENTS 4,862,153 A   8/1989   Nakatani et al.

(Continued)

FOREIGN PATENT DOCUMENTS

EP   0 609 074 A2   8/1994

(Continued)

OTHER PUBLICATIONS

Korean Office Action and English translation thereof maild Nov. 10, 2003 in corresponding Korean application No. 10-2001-0051634.

(Continued)

*Primary Examiner*—David Nelms
*Assistant Examiner*—David Y. Chung
(74) *Attorney, Agent, or Firm*—Nixon & Vanderhye, P.C.

(57) ABSTRACT

A semiconductor device of the present invention includes a film-like flexible substrate having formed thereon a wiring pattern, external connection terminals formed at both end portions of the flexible substrate; and a semiconductor element mounted on a surface side of the flexible substrate, wherein a folded part, which is folded down in U-shape to a back surface side of the flexible substrate, is formed in a fixed state at least at one end portion of the flexible substrate. With this structure, the semiconductor device is COF mounted, and, for example, in its application to a liquid crystal module wherein the semiconductor device is provided so as to face a liquid crystal panel, the external connection terminals of the flexible substrate can be connected to an inner surface of a module main body for a liquid crystal panel in a state the semiconductor element of the semiconductor device faces the inside of the module main body. As a result, since the semiconductor element can be mounted without being projected to the outside of the module main body, the liquid crystal module can be made thinner for the thickness of the semiconductor element.

7 Claims, 12 Drawing Sheets

U.S. PATENT DOCUMENTS

| | | | |
|---|---|---|---|
| 5,461,202 A * | 10/1995 | Sera et al. | 174/254 |
| 5,959,709 A * | 9/1999 | Asada et al. | 349/150 |
| 5,963,287 A * | 10/1999 | Asada et al. | 349/150 |
| 6,104,619 A | 8/2000 | Shigehiro | |
| 6,111,629 A | 8/2000 | Matsuhira et al. | |
| 6,366,264 B1 | 4/2002 | Kurumada | |
| 6,636,000 B2 * | 10/2003 | Asami et al. | 315/169.3 |
| 6,774,971 B2 | 8/2004 | Shirato et al. | |
| 6,903,794 B2 | 6/2005 | Fukuta et al. | |
| 6,986,598 B2 | 1/2006 | Chu et al. | |

FOREIGN PATENT DOCUMENTS

| | | | |
|---|---|---|---|
| EP | 0 911 678 A2 | 4/1999 | |
| JP | 63-177821 U | 11/1988 | |
| JP | 64-13523 A | 1/1989 | |
| JP | 2-259623 A | 10/1990 | |
| JP | 5-77968 U | 10/1993 | |
| JP | 7-14571 U | 3/1995 | |
| JP | 7-135383 A | 5/1995 | |
| JP | 09288278 A * | 11/1997 | |
| JP | 11-126039 | 5/1999 | |
| JP | 11-249583 | 9/1999 | |
| JP | 11-271793 A | 10/1999 | |
| JP | 11305250 A * | 11/1999 | |
| JP | 2000-31636 A | 1/2000 | |
| JP | 2001-125128 A | 5/2001 | |

OTHER PUBLICATIONS

European Search Report mailed Mar. 12, 2003 in corresponding EP application No. 01307252.5-2205.

Japanese Notice of Reasons for Refusal and English translation thereof mailed Aug. 2, 2005 in corresponding Japaneese application 2000-258068.

* cited by examiner

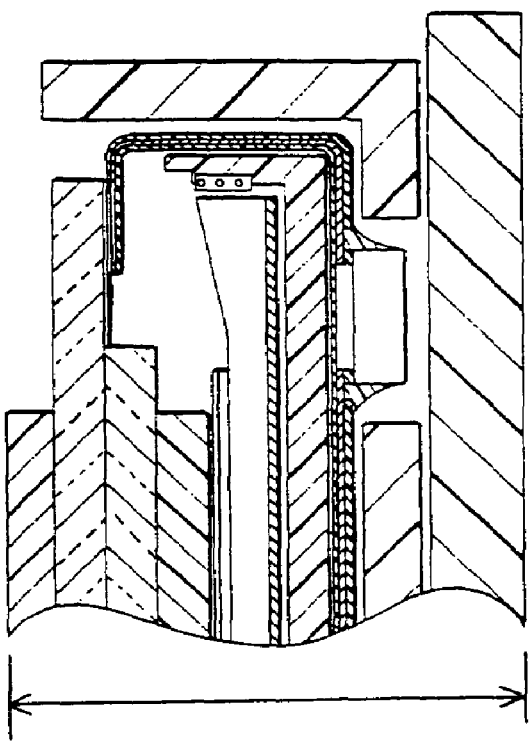
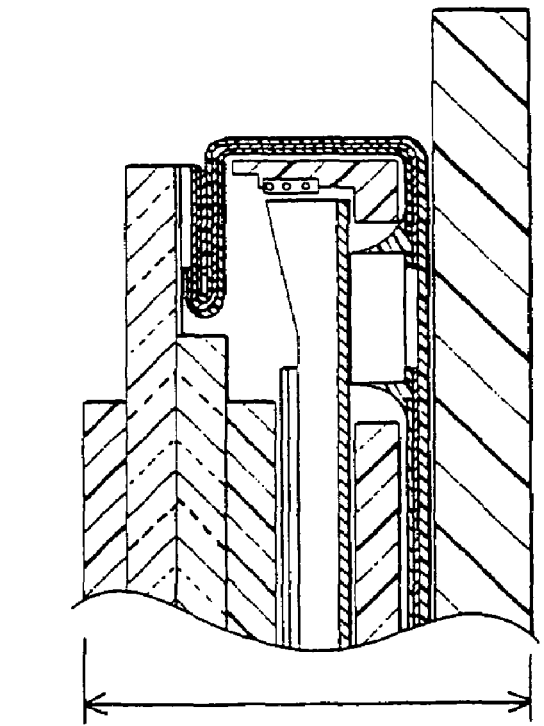
F I G. 3 (a)
F I G. 3 (b)

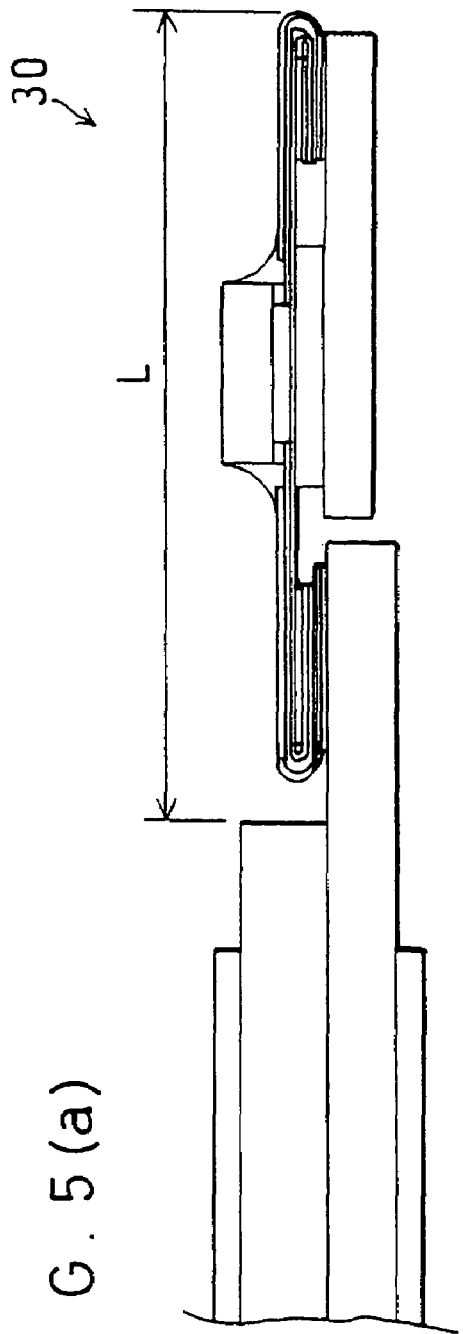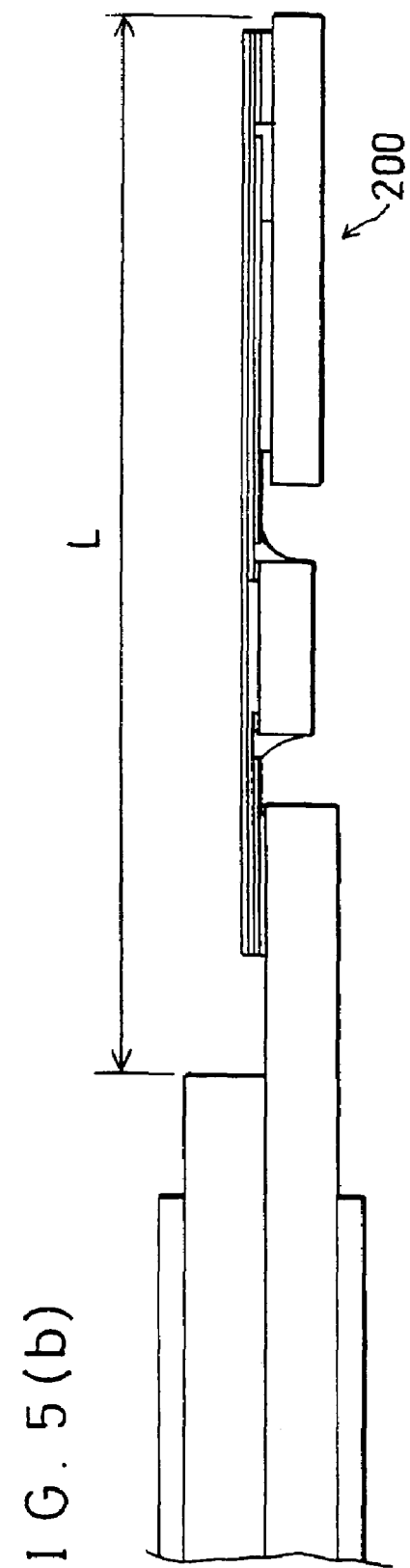
FIG. 5(a)
FIG. 5(b)

F I G. 6(a) 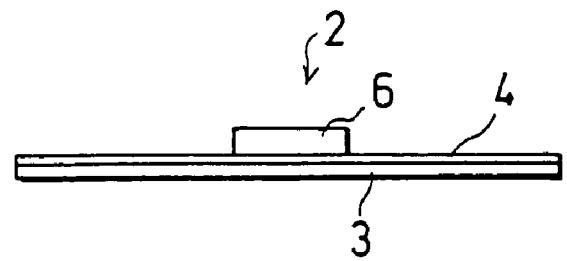
F I G. 6(b) 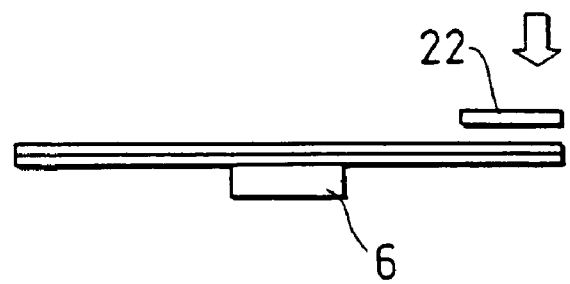
F I G. 6(c) 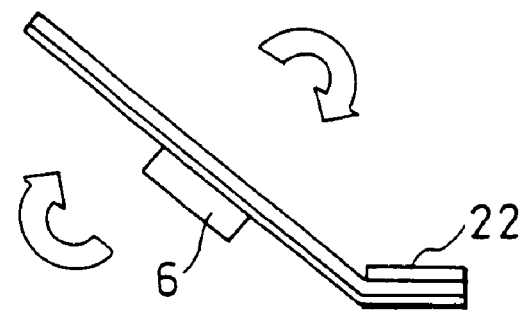
F I G. 6(d) 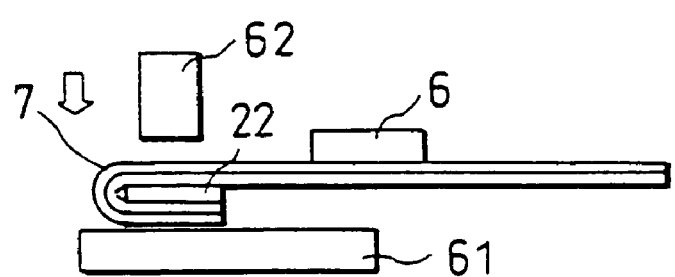
F I G. 6(e) 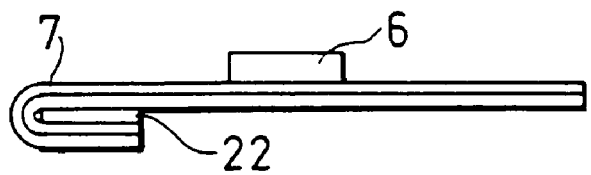

SEMICONDUCTOR DEVICE, LIQUID CRYSTAL MODULE ADOPTING SAME, METHOD OF MANUFACTURING LIQUID CRYSTAL MODULE, AND ELECTRONIC EQUIPMENT ADOPTING SAME

This application is a divisional of application Ser. No. 09/932,026, filed Aug. 20, 2001, now U.S. Pat. No. 6,903,794.

FIELD OF THE INVENTION

The present invention relates to a so-called COF (Chip-On-Film) type semiconductor device wherein a semiconductor element is mounted on a flexible wiring substrate, a liquid crystal module wherein a liquid crystal panel is connected to the semiconductor device and a method of manufacturing the liquid crystal module, and an electric component adopting the liquid crystal module, and more particularly relates to a connection structure of external connection terminals of the semiconductor device. The liquid crystal module is applicable to, for example, a portable phone, an automobile navigation equipment system, a personal data assistant (PDA), a word processor, a personal computer, television sets, motors, etc.

BACKGROUND OF THE INVENTION

A semiconductor device of a so-called COF (Chip-On-Film) structure wherein a semiconductor element is joined to or mounted on a flexible wiring substrate has been used in a variety of fields, and hereinafter, the semiconductor device of the COF structure is referred to as a "COF-type semiconductor device". Typical examples for applications of such COF-type semiconductor device include a liquid crystal driver adopting a semiconductor element of a liquid crystal driver integrated circuit (IC). The liquid crystal driver adopting the COF-type semiconductor device is structured such that one of the end portions of a flexible wiring substrate is connected to the liquid crystal display substrate for use in forming a liquid crystal panel, and the other end portion is connected to a printed wiring substrate, thereby forming a liquid crystal module.

The liquid crystal module adopting the COF-type semiconductor device can be formed in a thinner structure and is therefore suited for compact-size electronic equipments such as a portable telephone, a pager, a game machine, etc.

However, for the liquid crystal module adopting the COF-type semiconductor device, for example, as disclosed in Japanese Laid-Open Patent Publication No. 11-249583/1999 (Tokukaihei 11-249583, published on Sep. 17, 1999), a structure wherein a flexible wiring substrate is folded down to the back surface side of a liquid crystal panel after connecting the flexible wiring substrate to the liquid crystal panel is known.

Specifically, as illustrated in FIG. 11, a display device as a liquid crystal module 100 of the above publication includes a semiconductor device 104 wherein a semiconductor element 103 is joined or mounted on a back surface of a flexible substrate 102 having formed thereon a wiring pattern 101.

One end portion of the flexible substrate 102 in the semiconductor device 104 is connected to a liquid crystal panel 108 composed of an upper glass substrate 106 and a lower glass substrate 107 interposed between polarization plates 105. Below the lower glass substrate 107, provided is a light-directing plate 110 supported by an upper frame 109.

Further, along the side face of the light-directing plate 110, an LED (Light Emitting Diode) 111 is provided as a back light.

Below the upper frame 109, a lower frame 112 is provided, and between the upper frame 109 and the lower frame 112, a semiconductor element 103 mounted on the surface of the flexible substrate 102 is interposed so as to face downward. Namely, the semiconductor element 103 is stored in a recessed part of the lower frame 112, and the flexible substrate 102 is curved so as to have a cross section of substantially C-shape.

As described, the above display device has a connection part 113 formed on the upper glass substrate 106 of the liquid crystal panel 108, and the semiconductor element 103 is mounted on the flexible substrate 102 so as to be extended (projected) outward (downward in the FIG. 11).

In the foregoing liquid crystal module 100, if the connection part 113 is formed on the lower glass substrate 107, the semiconductor element 103 would be projected to the inside of the module main body. Conventionally, the above structure of forming the connection part 113 on the lower glass substrate 107 is adopted. In this conventional structure, however, the number of connection points for leading transparent wiring formed on the upper glass substrate 106 to the lower glass substrate 107 increases, and consequently, an area occupied by the connection points increases. For this reason, it is difficult to realize a compact size structure for an increased number of pixels. Therefore, in recent years, the structure wherein the connection part is formed on the upper glass substrate 106 is generally adopted for the reason that the number of connection points can be reduced by forming the transparent wiring of the lower glass substrate 107 in the upper part.

As illustrated in FIG. 12, in a conventional liquid crystal module 200 wherein a COF-type semiconductor device is connected to a liquid crystal panel in flat, an electrode 203 is formed on a lower glass substrate 202 of a liquid crystal panel 201. In this structure, in order to connect the semiconductor device 210 having a semiconductor element 214 mounted on the side of a conductor pattern 212 formed on the surface of a flexible substrate 211, it is required to turn over the semiconductor device 210 so that the semiconductor element 214 faces downward.

In this state, the semiconductor device 210 is connected to the liquid crystal panel 210 at one end portion of the flexible substrate 211, and the semiconductor device 210 is connected to the printed wiring substrate 214 at the other end portion of the flexible substrate 211.

As a result, a liquid crystal module 200 wherein the semiconductor device 210 is connected to the liquid crystal panel 201 in flat can be realized.

However, in the conventional semiconductor device and the liquid crystal module adopting the conventional semiconductor device have the following problems.

That is, in the liquid crystal module 100 illustrated in FIG. 11, the connection part 113 is formed on the upper glass substrate 106 of the liquid crystal panel 108. Therefore, in the structure of bending the flexible substrate 102, the semiconductor element 103 is inevitably projected to the outside. Consequently, a spacing for the thickness corresponding to the thickness of the semiconductor element 103 is required between the flexible substrate 102 and the main substrate 114, and a thinner structure is therefore difficult to achieved.

In the liquid crystal module 200 of the flat structure as illustrated in FIG. 12, the semiconductor element 214 is provided between the lower glass substrate 202 of the liquid crystal panel 201 and the printed wiring substrate 214 on the side of the semiconductor device 210, and therefore, a frame length L becomes longer.

SUMMARY OF THE INVENTION

It is an object of the present invention to provide a semiconductor device which realizes a liquid crystal module adopting the semiconductor device of a thinner or shorter structure, a liquid crystal module adopting such semiconductor device, a method of manufacturing the liquid crystal module, and an electronic equipment adopting the liquid crystal module.

In order to achieve the above object, a semiconductor device of the present invention is arranged so as to include:

a film-like flexible substrate having formed thereon a wiring pattern;

external connection terminals formed at both end portions of the flexible substrate; and a semiconductor element mounted on a surface side of the flexible substrate, wherein a folded part, which is folded down in U-shape to a back surface side of the flexible substrate, is formed in a fixed state at least at one end portion of the flexible substrate.

In the above structure of the present invention, the semiconductor device is COF (Chip-On-Film) mounted.

According to the foregoing structure, the folded part folded down in U-shape to the back surface of the flexible substrate is formed in a fixed state at least at one end portion of the flexible substrate. Namely, the folded part is folded down to be almost in contact with the back surface, the resulting foregoing folded structure is curved sharply like a hair pin. With this structure, it is therefore possible to form the folded section to be thinner than, for example, a glass substrate of a liquid crystal panel.

Therefore, as will be described later, in its application to a liquid crystal module wherein the semiconductor device and the liquid crystal panel are provided so as to face one another, it is possible to connect the external connection terminals of the flexible substrate to the inner surface of a module main body in the state where the semiconductor element of the semiconductor device is provided so as to face the inside of the module main body. As a result, it is possible to mount a semiconductor element without adopting such undesirable arrangement that the semiconductor element is projected to the outside of the liquid crystal module main body can be avoided. It is therefore possible to reduce the module structure by the thickness of the semiconductor element, thereby permitting a liquid crystal module of a thinner structure.

Additionally, for example, in a liquid crystal module wherein the semiconductor device, the liquid crystal panel, and the printed wiring substrate are mounted in flat, a semiconductor element can be mounted without adopting such undesirable arrangement that the semiconductor element is provided between the liquid crystal panel and the printed wiring substrate can be avoided.

As a result, the semiconductor device which realizes a device adopting the same of a thinner or shorter structure can be provided.

Additional objects, features, and strengths of the present invention will be made clear by the description below.

Further, the advantages of the present invention will be evident from the following explanation in reference to the drawings.

BRIEF DESCRIPTION OF THE DRAWINGS

FIGS. 3(a) and 3(b) are explanatory views for comparing a liquid crystal module with a conventional liquid crystal module in thickness;

FIGS. 5(a) and 5(b) are explanatory views for comparing a frame of the liquid crystal module of FIG. 4 with a frame of a conventional liquid crystal module in length;

FIGS. 6(a) through 6(e) are explanatory views illustrating the process of fixing an end portion of a film-like flexible substrate, which has formed thereon a wiring pattern, to a spacer by folding down the end portion in substantially U-shape to a back surface side of the flexible substrate after bonding the spacer to the back surface of the end portion in the process of manufacturing the liquid crystal module;

DESCRIPTION OF THE EMBODIMENTS

First Embodiment

The following descriptions will explain one embodiment of the present invention with reference to FIGS. 1 through 3(b). A liquid crystal module in accordance with the present invention is applicable to, for example, a small-size electronic equipment such as a portable phone, pager, a game machine, etc.

Figure 1:
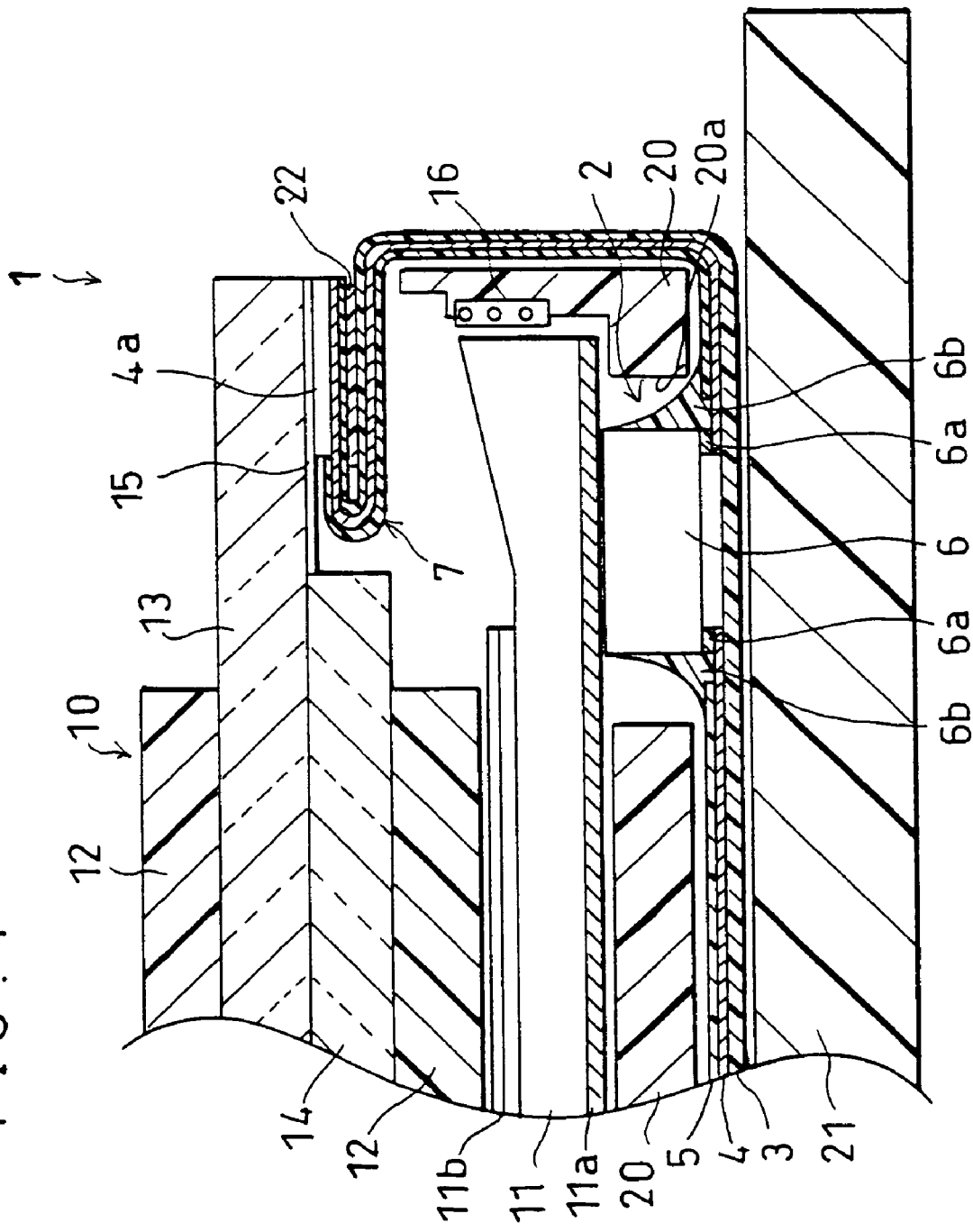
FIG. 1 which illustrates a semiconductor device and a liquid crystal module in accordance with one embodiment of the present invention is a cross-sectional view of a liquid crystal module in which the semiconductor device is provided so as to face a liquid crystal panel.

As illustrated in FIG. 1, a liquid crystal module 1 in accordance with the present embodiment includes a light-directing plate 11 (lighting means) formed above a frame 20 via a reflective sheet 11a. Further, above the light-directing plate 11, formed via a diffusing plate 11b is a liquid crystal panel 10 (member to be connected) comprised of an upper glass substrate 13 and a lower glass substrate 14 interposed between polarization plates 12. Between the upper glass substrate 13 and the lower glass substrate 14, a liquid crystal layer (not shown) and an electrode 15 are interposed. The upper glass substrate 13 is formed longer than the lower glass substrate 14, and the electrode 15 is mounted on the upper glass substrate 13 so as to be exposed and extended facing downward. Further, an LED (Light Emitting Diode) 16 is provided as a back light (lighting means) along a side face of the light directing plate 11.

The light crystal module 1 includes a semiconductor device 2 functioned as a liquid crystal driver for driving the liquid crystal panel 10. The semiconductor device 2 includes a flexible substrate 3 having a conductor pattern 4 (wiring pattern) formed on the surface; and a semiconductor element 6 serving as a liquid crystal driver integrated circuit (IC: Integrated Circuit) mounted on the surface side of the flexible substrate 3. Therefore, this semiconductor device 2 is COF (Chip-On-Film) mounted.

The flexible substrate 3 is constituted by a flexible thin film tape made of polyimide resin. Here, this flexible substrate 3 needs to be bent in a U-shape at the end portions as will be described later. It is therefore preferable to select the thickness of the flexible substrate 3 to be not more than 40 μm. However, a suitable thickness of the flexible substrate 3 is not limited to the above range, and may be varied to be suited for a material adopted.

The conductor pattern 4 formed on the surface of the flexible substrate 3 is made of copper, and on this conductor pattern 4, a protective film 5 is laminated. To the conductor pattern 4 of the flexible substrate 3, connected is the semiconductor element 6 on the side of the conductor pattern 4 via protrusion electrodes 6a. Here, the respective connection surfaces of the conductor pattern 4 and the semiconductor element 6 are sealed with resin 6b.

On the other hand, one end of the flexible substrate 3 having formed thereon the conductor pattern 4 is extended toward the liquid crystal panel 10, and an external connection terminal 4a formed on the end portion of the conductor pattern 4 is connected to the end portion of the electrode 15 formed on the upper glass substrate 13 on the liquid crystal panel 10 by an anisotropic electrically conductive adhesive agent. With the foregoing structure, a semiconductor element 6 of the semiconductor device 2 in accordance with the present embodiment functions as a liquid crystal driver integrated circuit (IC: integrated Circuit) for driving the liquid crystal panel 10. Additionally, the conductor pattern 4 formed on the flexible substrate 3 is connected to a printed wiring substrate (not shown) at the end portion on the opposite side of the liquid crystal panel 10, and an electric power is obtained from a power circuit, etc.

In the liquid crystal module 1 of the present embodiment, the flexible substrate 3 is smoothly curved in substantially C-shape. At the end portion of the liquid crystal panel 10, a folded part 7 of substantially U-shape is formed so as to be folded down to the back surface side of the flexible substrate. Namely, the flexible substrate 3 is folded down to the opposite side of the semiconductor element 6 mounted on the surface of the flexible substrate 3, i.e., to the back surface side of the flexible substrate 3. Therefore, at the end portion of the flexible substrate 3, the conductor pattern 4 is formed in the upper side in the Figure, and therefore, the external connection terminal 4a of the conductive pattern 4 facing upward is connected to the connection part of the electrode 15 formed on the upper glass substrate 13 of the liquid crystal panel 10 so as to face downward.

As a result, the flexible substrate 3 is folded so as to surround the frame 20 provided in a standing position at the end portion of the liquid crystal module 1 so as to support the light directing plate 11 and the LED 16, and the end portion of the flexible substrate 3 is formed in a U-shaped folded part 7. Therefore, the inside of the liquid crystal module 1 as a whole has a cross-section of substantially S-shape.

Since the flexible substrate 3 is formed so as to have a cross-section of substantially S-shape, the semiconductor element 6 mounted on the surface of the flexible substrate 3 faces the inside of the liquid crystal module 1, and also this semiconductor element 6 can be stored within a spacing 20a between the frames 20 such as a recessed section or an opening section. Therefore, below the flexible substrate 3, a main substrate 21 is formed along the flexible substrate 3, and formation of unnecessary spacing can therefore be avoided.

The spacing 20a may be a recessed part or a groove formed in the frame 20 but preferably be an opening formed between the frames 20 because by storing the semiconductor element 6 within the spacing 20a between the frames 20, the liquid crystal module 1 of a thinner structure can be realized. In the structure of FIG. 1, a single semiconductor element 6 is mounted on the flexible substrate 3; however, when mounting an electric component such as other semiconductor element 6, resistance, etc., the opening section 20a may be formed at a corresponding position.

In the liquid crystal module 1 in accordance with the present embodiment, the U-shaped folded part 7 of the flexible substrate 3 is folded at the end portion of the flexible substrate 3, and the end portion of the flexible substrate 3 is formed extremely thin. Therefore, the folded structure is, for example, thinner than the lower glass substrate 14 of the liquid crystal panel 10. As a result, the folded part 7 is formed within the thickness of the lower glass substrate 14, and thus, an increase in thickness of the liquid crystal module 1 at the corresponding portion can be avoided.

In the U-shaped folded part 7 of the flexible substrate 3 in accordance with the present embodiment, a spacer 22 is provided for fixing the folded part 7, and this spacer 22 is fixed by an adhesive agent. The spacer 22 is formed by a thin plate-like material; however, this spacer 22 is not necessarily be limited to this. For example, a double-stick face tape, a thermosetting adhesive agent, a thermoplastic agent, etc., whose thickness is ignorable, may be adopted.

Figure 2:
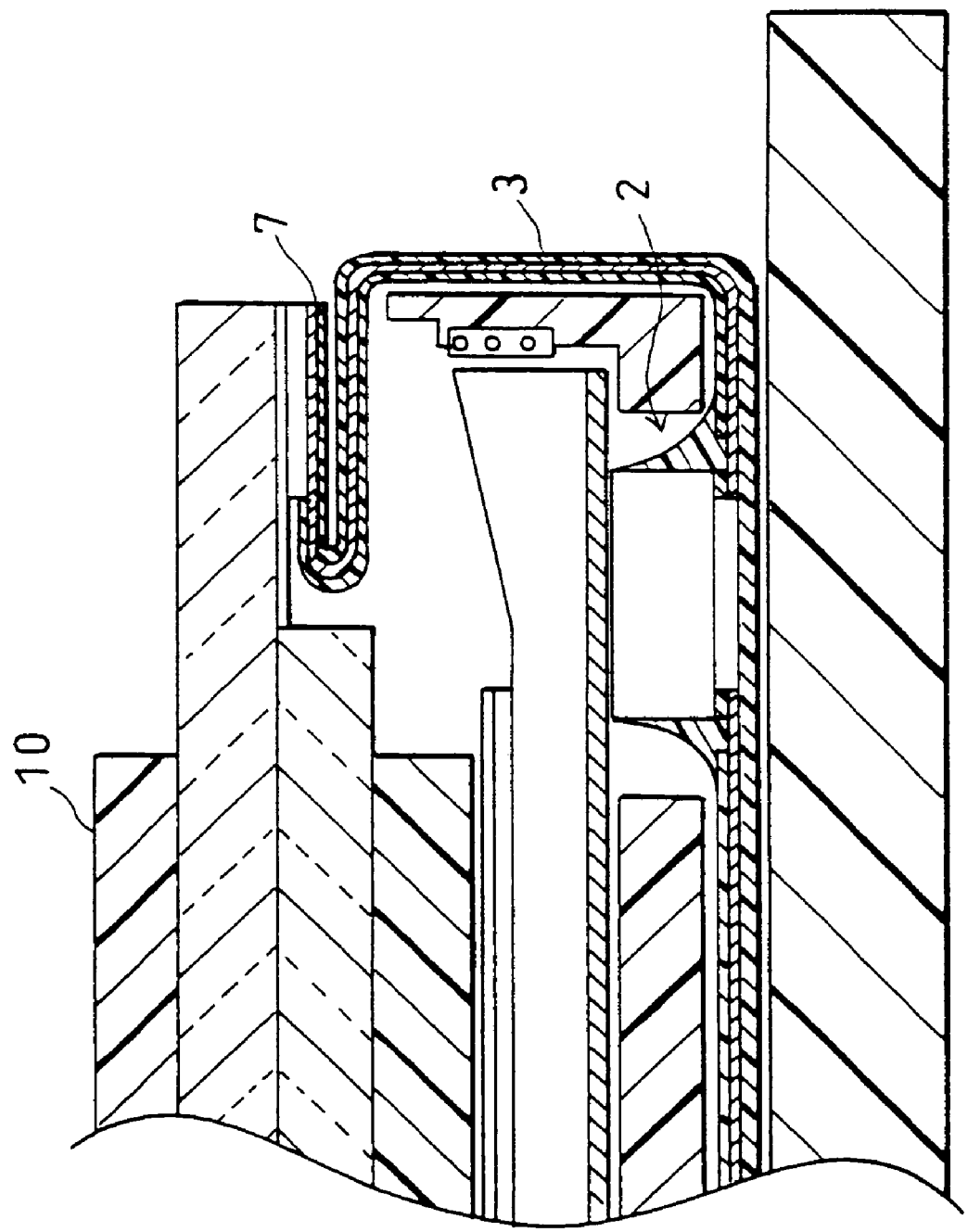
FIG. 2 is a cross-sectional view of a liquid crystal module without having a spacer formed in a folded part.

The liquid crystal module 1 is arranged such that the spacer 22 is sandwiched in U-shaped folded part 7. However, the present invention is not limited to this structure, and, for example, as illustrated in FIG. 2, the structure without a spacer 22 may be adopted. The structure from which the spacer 22 can be omitted can be realized, for example, by adopting a flexible substrate 3 which is easy to be bent, yet not liable to be broken. With this structure, an increase in the number of components can be prevented.

As described, the semiconductor device 2 of the present embodiment is COF (Chin-ON-Film) mounted.

In the present embodiment, the folded part 7 folded down in U-shape to the back surface of the flexible substrate 3 is formed in the fixed state at least at one end portion of the flexible substrate 3. Namely, the folded part 7 is folded down to be almost in contact with the back surface side. Therefore, the foregoing folded structure is curved sharply like a hair pin, and as a result, it is possible to form the folded part 7 thinner than the lower glass substrate 14 of the liquid crystal panel 10.

Therefore, in the liquid crystal module 1 wherein the semiconductor device 2 and the liquid crystal panel 10 are provided so as to face one another, the external connection terminals 4a of the conductive pattern 4 of the flexible substrate 3 can be connected to the inner surface of the module main body of the liquid crystal panel 10 in the state the semiconductor element 6 of the semiconductor device 2 faces the inside of the module main body.

As a result, the liquid crystal module 1 in accordance with the present embodiment shown in FIG. 3(a) can be made thinner for the thickness of the semiconductor element 6 as compared to the structure of the conventional liquid crystal module illustrated in FIG. 3(b) as the semiconductor element 6 is not projected to the outside of the module main body.

As a result, the semiconductor device 2 which realizes the liquid crystal module 1 adopting the same of a thinner structure can be realized.

The semiconductor device 2 in accordance with the present embodiment is arranged such that a spacer 22 for fixing the folded structure is formed in the inside of the U-shaped folded part 7.

Therefore, the folded structure can be maintained by the spacer 22 provided in the substantially U-shape structure of the folded part 7.

As a result, the folded state remains unchanged, and the conductor pattern 4 can be prevented from being cut off, thereby realizing a quality semiconductor device 2.

The semiconductor device 2 in accordance with the present embodiment is connected to the liquid crystal panel 10 provided on the side of the semiconductor element 6 of the semiconductor device 2 in such a manner that the external connection terminals 4a face the upper glass substrate 13 of the liquid crystal panel 10. Namely, for example, in the case where the member to be connected is the liquid crystal panel 10, the semiconductor device 2 and the liquid crystal panel 10 are provided so as to face one another.

In the present embodiment, the U-shaped folded part 7 which is folded down to the back surface side of the flexible substrate 3 is formed at least at the end portion on the side of the liquid crystal panel 10, i.e., one end portion of the flexible substrate 3. Therefore, by forming the flexible substrate 3 so as to have a cross section of substantially S-shape within the module main body, the external connection terminals 4a can be connected to the liquid crystal panel 10 provided on the side of the semiconductor element 6 of the semiconductor device 2 in such a manner that the external connection terminals 4a face the upper glass substrate 13 of the liquid crystal panel 10.

With the foregoing structure, the semiconductor element 6 can be mounted so as to face the inside of the module main body. Therefore, in the structure wherein the semiconductor device 2 and the liquid crystal panel 10 are provided so as to face one another, the liquid crystal module adopting the semiconductor device 2 of a thinner structure can be realized.

In the semiconductor device 2 of the present embodiment, for the spacer 22, a bonding tape such as a double stick face tape, or an adhesive agent such as a thermosetting adhesive agent, etc., may be adopted.

With the above structure, the spacer 22 functions as an adhesive tape, or an adhesive agent, the folded part 7 can therefore be fixed with ease.

The semiconductor device 2 in accordance with the present embodiment is arranged such that the flexible substrate 3 is made of polyimide series resin and the thickness thereof is selected to be not more than 40 μm.

By adopting the flexible substrate 3 made of polyimide resin in thickness of not more than 40 μm, the flexible substrate 3 can be folded in U-shape with ease.

In the liquid crystal module 1 in accordance with the present embodiment, one external connection terminal 4a of the semiconductor device 2 is connected to the liquid crystal panel 10, and the other external connection terminal (not shown) is connected to the printed wiring substrate (not shown). With this structure, the liquid crystal module 1 can be formed by adopting the semiconductor device 2 wherein U-shaped folded sections 7 which are folded down to the back surface side are formed at both end portions of the flexible substrate 3 in the fixed state. As a result, the liquid crystal module 1 of a thinner structure can be realized.

In the liquid crystal module 1 wherein the semiconductor device 2 and the liquid crystal panel 10 are provided so as to face one another, it is preferable that the conductor pattern 4 of the flexible substrate 3 be connected to the liquid crystal panel 10 in the state where the semiconductor element 6 of the semiconductor device 2 faces the inside of the module main body. With this structure, the liquid crystal module 1 of a thinner structure can be realized.

In this regard, for the liquid crystal module 1 of the present embodiment, since the flexible substrate 3 is provided in the inside of the module main body so as to have a cross section of substantially S-shape, it is possible to connect the semiconductor device 2 to the liquid crystal panel 10 in the above structure with ease. As a result, the liquid crystal module 1 of a thinner structure can be realized with ease.

The liquid crystal module 1 of the present embodiment is arranged such that the light-directing plate 11 and the LED 16 are provided between the liquid crystal panel 10 and the flexible substrate 3, and that the semiconductor element 6 mounted on the flexible substrate 3 faces the inside of the module main body.

As a result, it is possible to surely reduce the thickness of the liquid crystal module 1 provided with the light-directing plate 11 and the LED 16 with ease.

Second Embodiment

Figure 4:
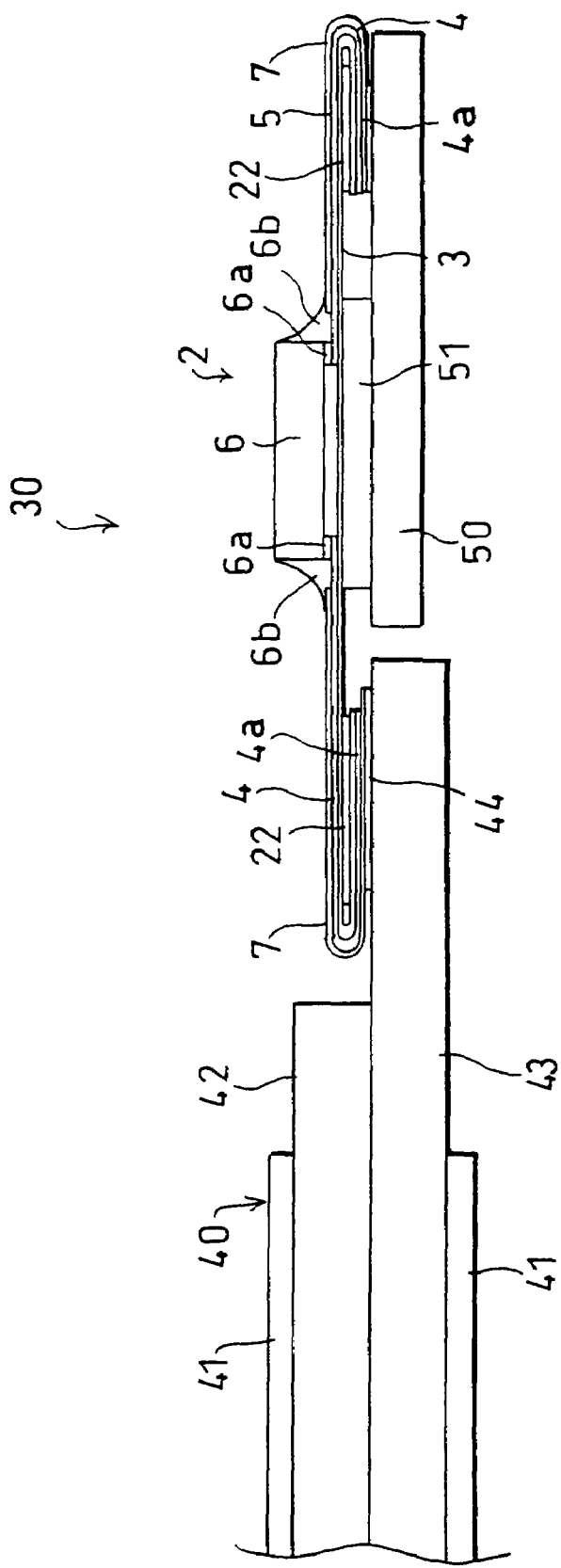
FIG. 4 which illustrates a semiconductor device and a liquid crystal module in accordance with another embodiment the present invention is a cross-sectional view illustrating the liquid crystal module of such structure that the semiconductor device, a liquid crystal panel and a printed wiring substrate are mounted in flat.
Figure 7A:
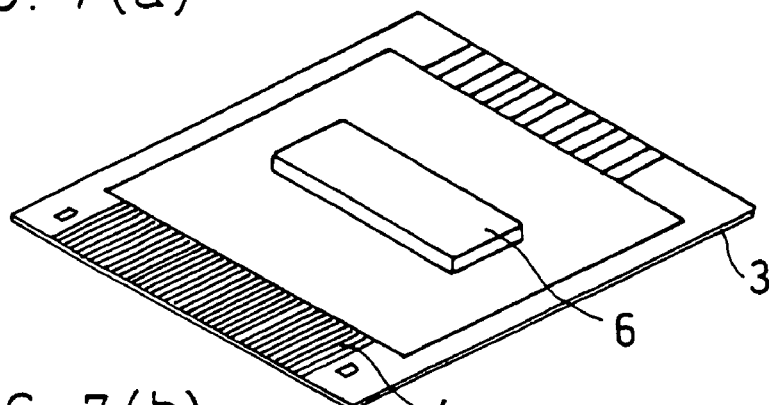
FIGS. 7(a) through 7(d) are perspective views illustrating the processes of manufacturing the liquid crystal module.
Figure 7B:
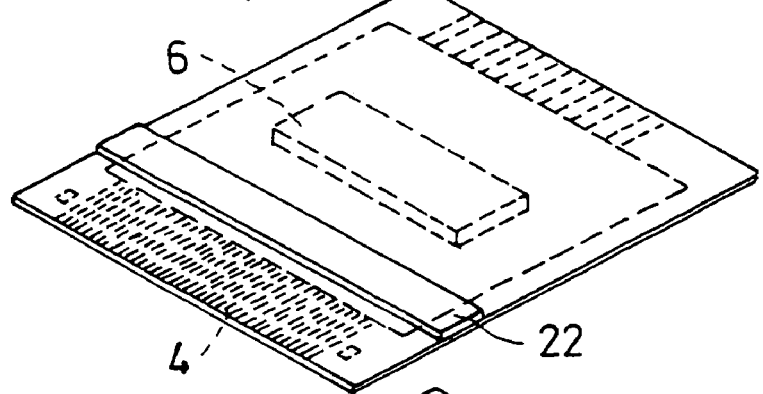
Figure 7C:
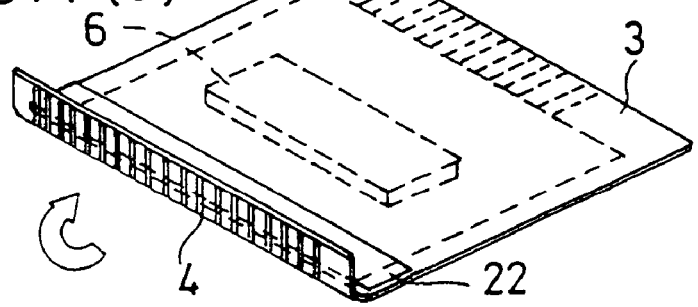
Figure 7D:
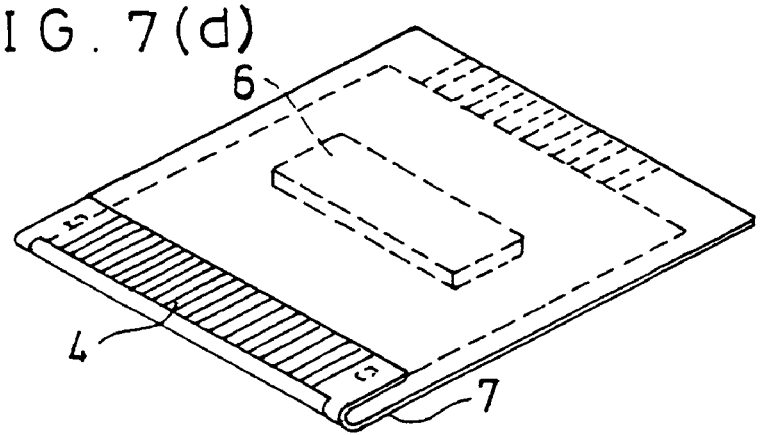

The following will explain still another embodiment of the present invention in reference to FIGS. 4 through 5(b). For ease of explanation, members (structures) having the same functions as those shown in the drawings pertaining to the first embodiment above will be given the same reference symbols, and explanation thereof will be omitted here. It should be noted here that respective characteristic structures of the first embodiment are applicable to the present embodiment.

As illustrated in FIG. 4, the liquid crystal module 30 in accordance with the present embodiment is arranged such that the semiconductor device 2 is connected to the liquid crystal panel 40 (member to be connected) in flat.

Specifically, the liquid crystal panel 40 of the liquid crystal module 30 is composed of an upper glass substrate 42 and a lower glass substrate 43 interposed between polarization plates 41. Further, between the upper glass substrate 42 and the lower glass substrate 43, formed are a liquid crystal layer (not shown) and an electrode 44. The lower glass substrate 43 is formed longer than the upper glass substrate 42, and the electrode 44 is mounted on the lower glass substrate 43 so as to be exposed from the upper surface of the lower glass substrate 43 and face upward.

On the other hand, the semiconductor device 2 includes a semiconductor element 6 mounted on the side of the surface of the flexible substrate 3. This semiconductor element 6 functions as a liquid crystal driver integrated circuit (IC: Integrated Circuit).

On the upper surface of the flexible substrate 3, the conductor pattern 4 made of copper and the protective film 5 are laminated in this order as in the first embodiment. At the center of the conductor pattern 4 of the flexible substrate 3, the semiconductor element 6 is connected to protrusion electrodes 6*a*, and the connection surface is sealed with resin 6*b*.

In the flexible substrate 3 in accordance with the present embodiment, U-shaped folded parts 7 are formed at both end portions. Then, the external connection terminal 4*a* of the conductor pattern 4 in one of the folded parts 7 is connected to the electrode 44 of the lower glass substrate 43 of the liquid crystal panel 40 by an anisotropic electrically conductive adhesive agent. On the other hand, the external connection terminal 4*a* of the conductor pattern 4 in the other folded part 7 is connected to the upper surface of the end portion of a printed wiring substrate 50 by bonding using an adhesive tape 51 below the central part of the flexible substrate 3.

As illustrated in FIG. 5(*a*), in the described liquid crystal module 30 of the present embodiment, as compared to a conventional liquid crystal module 200 illustrated in FIG. 5(*b*), the frame length L can be reduced for the following mechanism. That is, in the conventional liquid crystal module 200, the lower glass substrate and the printed wiring substrate for connecting the liquid crystal panel are provided on the side where the semiconductor element is projected, and the printed wiring substrate cannot be formed close to the lower glass substrate. Namely, it is required for the printed wiring substrate to have a predetermined width for mounting wiring or other electric components, and therefore the size of the printed wiring substrate cannot be reduced. Therefore, as described, in the case where the semiconductor element is protruded between the lower glass substrate and the printed wiring substrate, the frame length L cannot be reduced.

In the described liquid crystal module 30, the connection part of the electrode 44 is formed on the upper surface of the lower glass substrate 43; however, the present invention is not limited to this structure. For example, the connection part may be formed on the upper glass substrate 42. In this case, it is not necessarily to form the folded part 7 in the flexible substrate 3 of the semiconductor device 2.

As described, the semiconductor device 2 adopted in the present embodiment is COF (Chip-On-Film) mounted.

In the present embodiment, the folded parts 7 folded down in U-shape to the back surface of the flexible substrate 3 are formed in the fixed state at both end portions of the flexible substrate 3. Namely, the respective folded parts 7 are folded down almost in contact with the back surface. Therefore, the foregoing folded structure is curved sharply like a hair pin.

Therefore, in the liquid crystal module 30 wherein the semiconductor device 2, a liquid crystal panel 40 and a printed wiring substrate 50 are mounted in flat; namely, these members are mounted on a plane, the semiconductor element 6 is not formed between the liquid crystal panel 40 and the printed wiring substrate 50.

As a result, as compared to the conventional liquid crystal module, the length of the liquid crystal module 30 of the present embodiment can be reduced for the length of the semiconductor element 6. Therefore, the liquid crystal module 30 of a thinner structure can be realized.

As a result, the semiconductor device 2 which permits the liquid crystal module 30 adopting the semiconductor device 2 of shorter structure can be realized.

The liquid crystal module 30 in accordance with the present embodiment is arranged such that the semiconductor device 2, the liquid crystal panel 40 and the printed wiring substrate 50 are mounted in flat on the back surface side of the semiconductor element 6 in the semiconductor device 2. Namely, in the state where the member to be connected is the liquid crystal panel 40, the surface of the lower glass substrate 43 of the liquid crystal panel 40 and the external connection terminal 4*a* in the conductor pattern 4 of the flexible substrate 3 are mounted facing down. Additionally, the printed wiring substrate 50 is provided on the back surface side of the semiconductor element 6.

In this state, U-shaped folded sections 7 are formed in a fixed state so as to be folded down to the back surface side of the flexible substrate at both end portions of the flexible substrate. As a result, such connection structure that the semiconductor element 6 is provided in the upper part, and the lower glass substrate 43 of the liquid crystal panel 40 and the printed wiring substrate 50 are provided in the lower part can be achieved.

Therefore, the semiconductor element 6 is not provided between the lower glass substrate 43 of the liquid crystal panel 40 and the printed wiring substrate 50. As a result, the length of the liquid crystal module 30 can be reduced for the length of the semiconductor element 6.

Therefore, in the flat mounted structure of the semiconductor element 6, the liquid crystal panel 40 and the printed wiring substrate 50, the semiconductor device 2 which permits the liquid crystal module 30 adopting the semiconductor device 2 of a shorter structure can be realized.

The liquid crystal module 30 in accordance with the present embodiment is arranged such that one of the external connection terminals 4*a* of the semiconductor device 2 is connected to the lower glass substrate 43 of the liquid crystal panel 40. On the other hand, the other external connection terminal 4*a* is connected to the printed wiring substrate 50. Therefore, the liquid crystal module 30 adopting the semiconductor device 2 wherein the U-shaped folded parts 7 folded down to the back surface side are formed in the fixed state at both end portions of the flexible substrate 3 can be realized. As a result, the liquid crystal module 30 of a shorter structure can be realized.

In the liquid crystal module 30 in accordance with the present embodiment, the semiconductor device 2, the liquid crystal panel 40 and the printed wiring substrate 50 are mounted in flat.

According to the structure of the present invention, since the semiconductor device 2, the liquid crystal panel 40 and the printed wiring substrate 50 are mounted on a plane, the semiconductor device 2 wherein U-shaped folded parts 7 folded down to the back surface of the flexible substrate 3 are formed in a fixed state at least at the both end portions of the flexible substrate 3 can be connected to the liquid crystal panel 40 without having the semiconductor element 6 between the lower glass substrate 43 of the liquid crystal panel 40 and the printed wiring substrate 50. As a result, the liquid crystal module 30 of a shorter structure can be realized.

Third Embodiment

The following will explain still another embodiment of the present invention in reference to FIGS. 6(*a*) through 8(*c*). For ease of explanation, members (structures) having the same functions as those shown in the drawings pertaining to the first embodiment will be given the same reference symbols, and explanation thereof will be omitted here. It should be noted here that respective characteristic structures of the first embodiment are applicable to the present embodiment.

In the present embodiment and also in the next fourth embodiment, in the manufacturing method of the liquid crystal modules 1 and 30, the method of forming U-shaped folded part 7 of the semiconductor device 2 adopted in the first and second embodiments and the method of connecting the liquid crystal panels 10 and 40 will be explained. In the present embodiment, explanations will be given through the case wherein the U-shaped folded part 7 of the semiconductor device 2 is connected to the liquid crystal panel 40; however, the liquid crystal module 1 of the first embodiment may be adopted as well.

First, in the present embodiment, the process of joining the flexible substrate 3 to the lower glass substrate 43 of the liquid crystal panel 40 after folding the end portion of the flexible substrate 3 in substantially U-shape when mounting the flexible substrate 3 in a state where the end portion is folded via the spacer 22.

As illustrated in FIG. 6(*a*), in the process of forming the semiconductor device 2, the semiconductor element 6 is mounted on the flexible substrate 3 having formed thereon the conductor pattern 4, and the flexible substrate 3 is then cut out in a predetermined outer shape.

Next, as illustrated in FIG. 6(*b*), after placing the semiconductor device 2 so that the semiconductor element 6 faces downward, the spacer 22 with the adhesive agent is pasted to the end portion on the back surface side, and as illustrated in FIG. 6(*c*), the flexible substrate 3 is folded by rotating the flexible substrate 3 about the corner of the spacer 22.

Next, as illustrated in FIG. 6(*d*), the end portion of the flexible substrate 3 is mounted on a stage 61, and this end portion is depressed using the bonding tool 62 from the surface side of the flexible substrate 3, i.e., from the side the semiconductor element 6 is mounted. As a result, as illustrated in FIG. 6(*e*), the spacer 22 is mounted in the inside of the U-shaped structure of the folded part 7.

The folding state of the semiconductor device 2 in the foregoing processes are as illustrated in the perspective views of FIGS. 7(*a*) through 7(*d*).

Figure 8A:
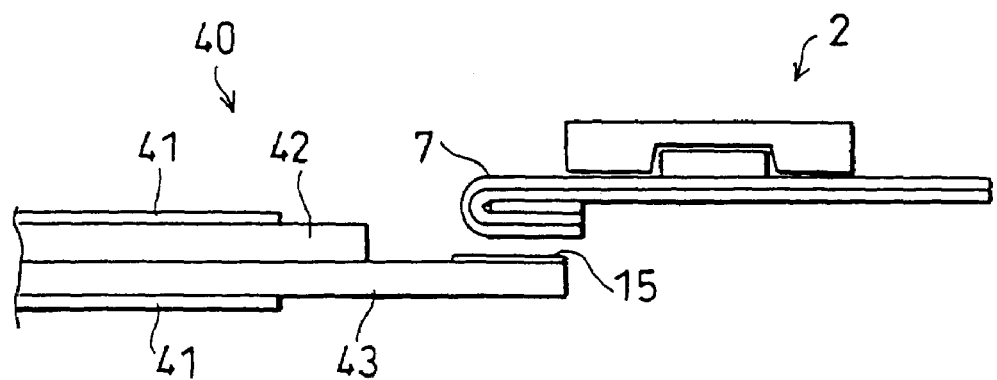
FIGS. 8(a) through, 8(c) are explanatory views illustrating the process of connecting an external connection terminal of the flexible substrate to the liquid crystal panel after the manufacturing process of the liquid crystal module.
Figure 8B:
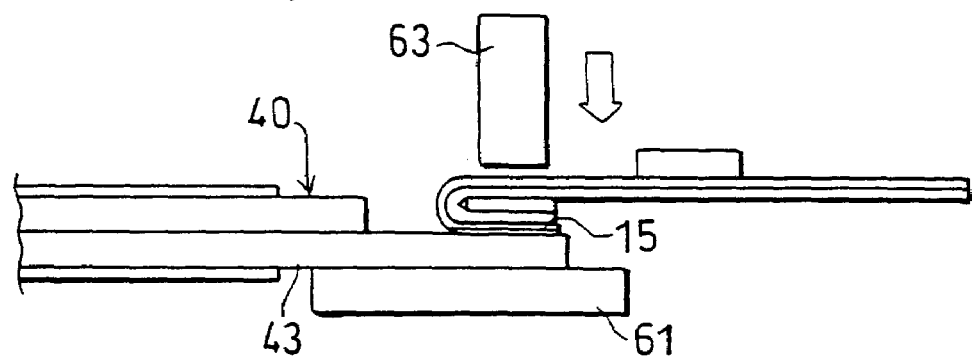
Figure 8C:
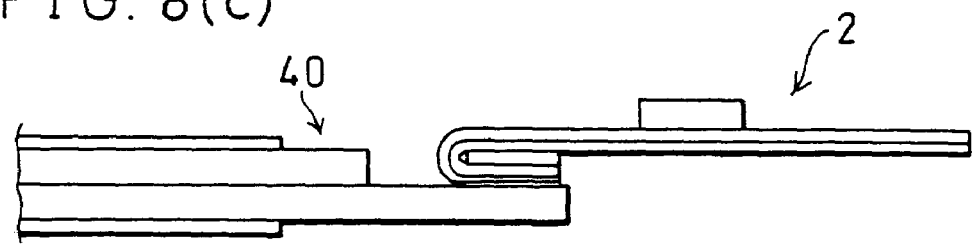

Next, as illustrated in FIG. 8(*a*), the semiconductor device 2 having formed thereon the folded part 7 is moved closer to the electrode 15 facing upward in the lower glass substrate 43 of the liquid crystal panel 40. Further, as illustrated in FIG. 8(*b*), after making the stage 61 contact the lower side of the substrate 2, the substrate 2 is pressurized from above with an applied heat by means of a bonding tool 63, thereby connecting and fixing the electrode 15 and the conductor pattern 4 of the flexible substrate 3 by bonding using the anisotropic electrically conductive adhesive agent.

As a result, as illustrated in FIG. 8(*c*), the semiconductor device 2 is connected to the liquid crystal panel 40.

According to the foregoing manufacturing method, as illustrated in FIG. 6(*d*), when forming the U-shaped folded part 7 in the flexible substrate 3, the flexible substrate 3 is depressed by the pressurizing member 62 having the spacer 22 sandwiched in between, and the U-shaped portion can be formed smoothly by sandwiching the spacer 22. As a result, the conductor pattern 4 can be prevented from being cut off.

As described, according to the method of manufacturing the liquid crystal module 30 of the present embodiment, first, the spacer 22 is bonded to the back surface of the end portion in the film-like flexible substrate 3 having formed thereon the conductor pattern 4, and then the end portion is fixed to the spacer 22 by folding down the end portion in substantially U-shape to the back surface of the flexible substrate 3. Thereafter, the connection process of connecting the liquid crystal panel 40 to the conductor pattern 4 of the flexible substrate 3 is performed.

According to the foregoing method, the U-shaped folded part 7 is fixed beforehand by the spacer 22 in the semiconductor device 2. Therefore, when connecting the semiconductor device 2 to the liquid crystal panel 40, the semiconductor device 2 and the liquid crystal panel 40 may be connected using a generally used connection device such as a bonding tool 63, etc.

As a result, the method of manufacturing the liquid crystal modules 1 and 30 of thinner or shorter structure can be realized.

Fourth Embodiment

The following will explain still another embodiment of the present invention in reference to FIGS. 9(*a*) through 10(*c*). For ease of explanation, members (structures) having the same functions as those shown in the drawings pertaining to the first through third embodiments above will be given the same reference symbols, and explanation thereof will be omitted here. It should be noted here that respective characteristic structures of the first through third embodiments are applicable to the present embodiment.

In the present embodiment, when mounting the flexible substrate 3 in a state where the end portion thereof is folded via the spacer 22, a folding line is formed beforehand, and then the flexible substrate 3 is bonded to the liquid crystal panel 40. Thereafter, the spacer 22 is bonded to the end portion of the flexible substrate 3, and the end portion is then folded, thereby forming the U-shaped folded part 7.

According to the foregoing method, it is possible to fold the flexible substrate 3 without having stress applied to the folded part 7 when pressurizing the flexible substrate 3 and the liquid crystal panel 40 under an applied heat.

First, as illustrated in FIG. 9(*a*), the semiconductor device 2 wherein the semiconductor element 6 is mounted to the flexible substrate 3 having formed thereon the conductor pattern 4 is cut out in a predetermined shape, and the semiconductor device 2 is then turned over.

Next, as illustrated in FIG. 9(*b*), in order to form a folding line in a vicinity of the end portion of the flexible substrate 3, the flexible substrate 3 is, for example, folded by around 45 degrees. Thereafter, the flexible substrate 3 is fixed to the bonding tool 63 with the surface of the end portion of the flexible substrate 3 while maintaining the folded structure.

Next, as illustrated in FIG. 9(*c*), an anisotropic electrically conductive adhesive agent is applied to the connection part of the electrode 15 in the liquid crystal panel 40, and then, the surface at the end portion of the flexible substrate 3 having the folding line is made in contact with the anisotropic electrically conductive adhesive agent. Thereafter, the respective positioning of the electrode 15 of the lower glass substrate 32 of the liquid crystal panel 40 and the conductor pattern 4 on the flexible substrate 3 are performed.

Figure 9A:
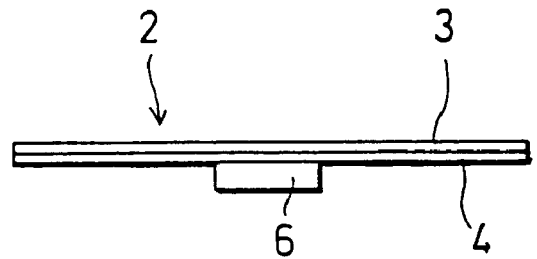
FIGS. 9(a) through 9(d) which show another method of manufacturing the liquid crystal module are explanatory views illustrating a process of connecting an external connection terminal of a film-like flexible substrate, which has formed thereon a wiring pattern, to the liquid crystal panel after slightly folding down the end portion to the back surface side.
Figure 9B:
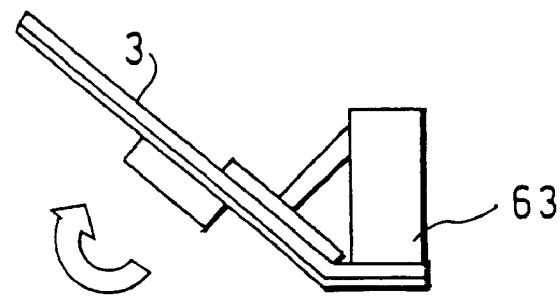
Figure 9C:
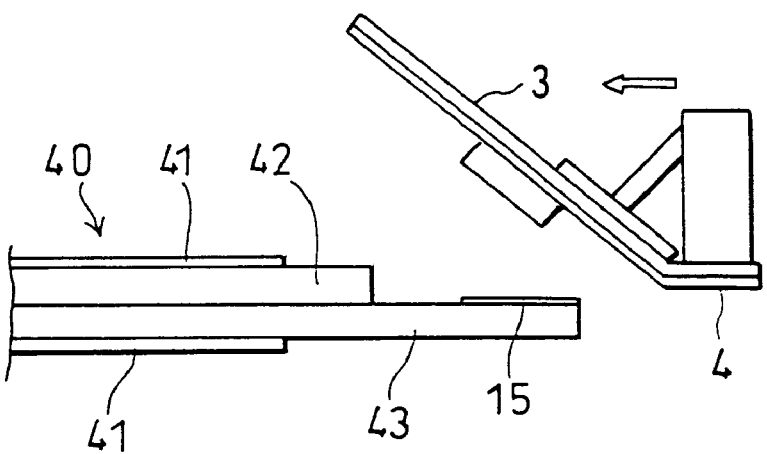
Figure 9D:
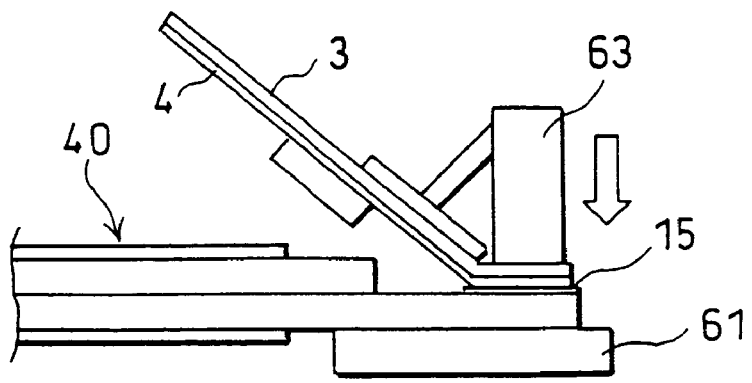

Next, as illustrated in FIG. 9(d), the liquid crystal panel 40 is mounted on the stage 61, and by means of the bonding tool 63, the connection part between the liquid crystal panel 40 and the flexible substrate 3 is fixed using the anisotropic electrically conductive adhesive agent by carrying out the pressurizing process under an applied heat.

Figure 10A:
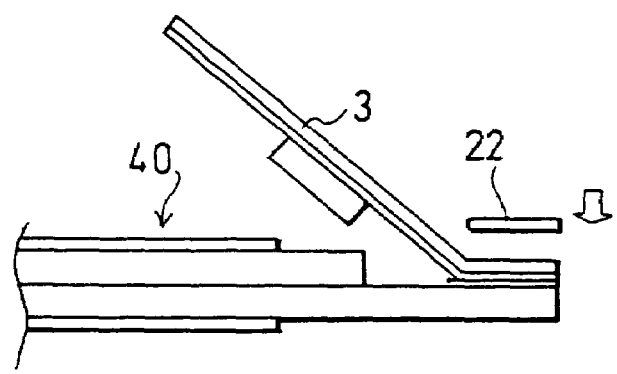
FIGS. 10(a) through 10(c) are explanatory views illustrating a process of fixing the flexible substrate to a spacer by bonding the spacer to the back surface of an end portion of the flexible substrate after the manufacturing process of the liquid crystal module, and folding down the end portion of flexible substrate in substantially U-shape to the back surface side.
Figure 10B:
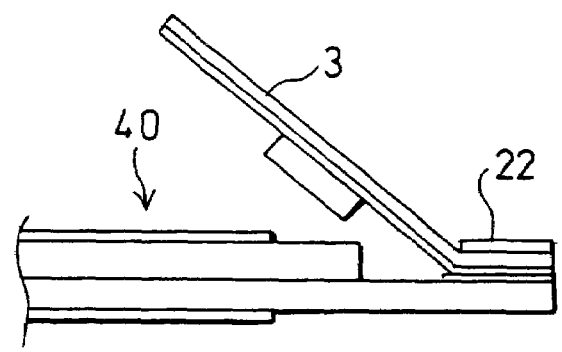

Next, as illustrated in FIG. 10(a), the bonding tool 63 is taken out, and the spacer 22 with the adhesive agent is set to the back surface of the connecting section at the end portion of the flexible substrate 3, and then as illustrated in FIG. 10(b), the spacer 22 is bonded.

Figure 10C:
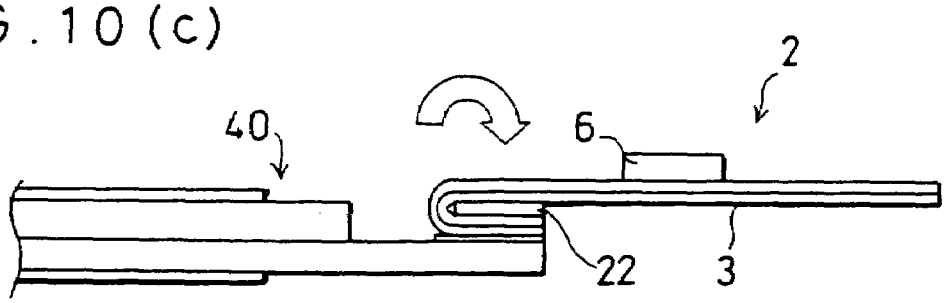
Figure 11:
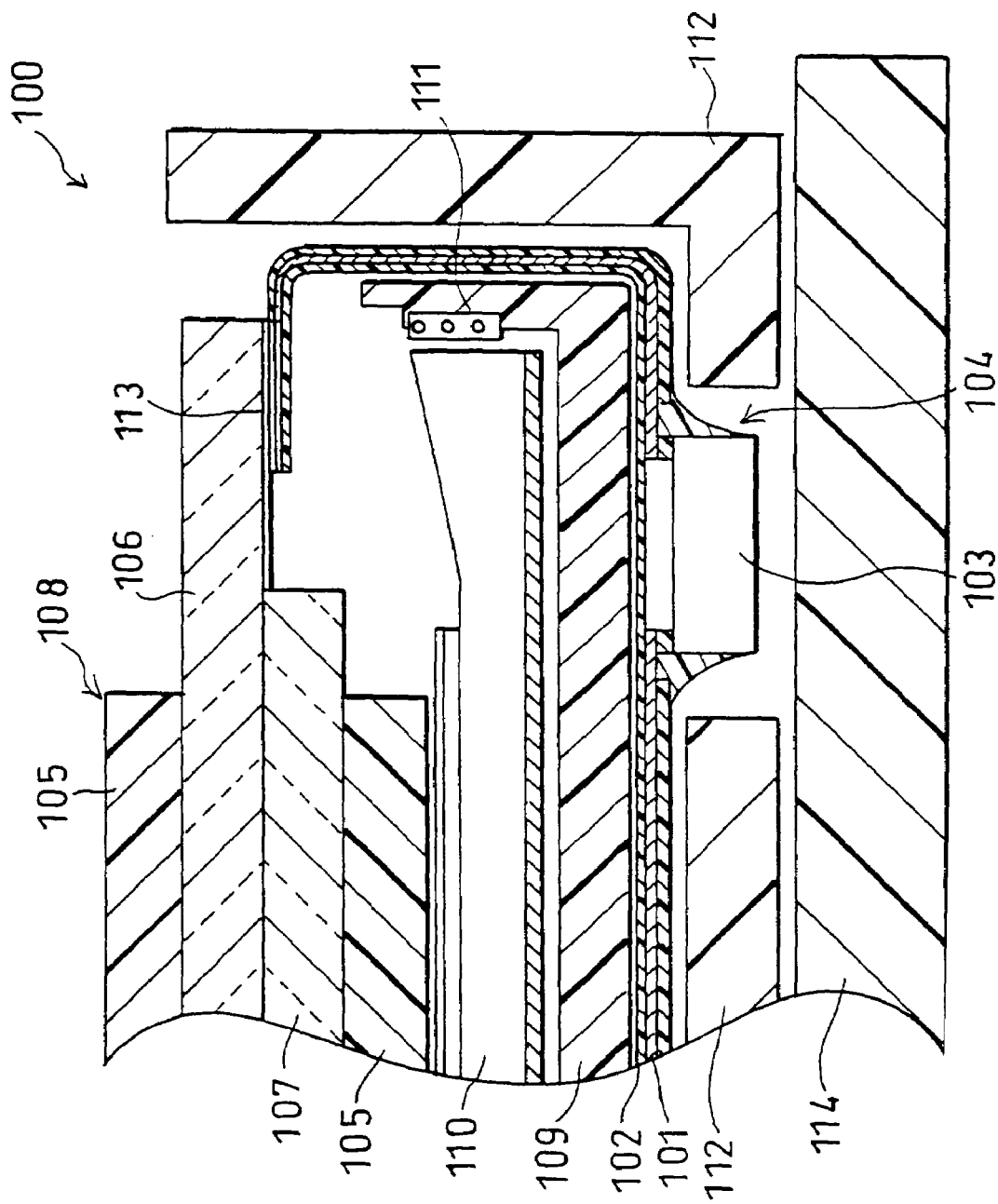
FIG. 11 is a cross-sectional view illustrating a liquid crystal module wherein a conventional semiconductor device and a liquid crystal panel are provided so as to face one another.
Figure 12:
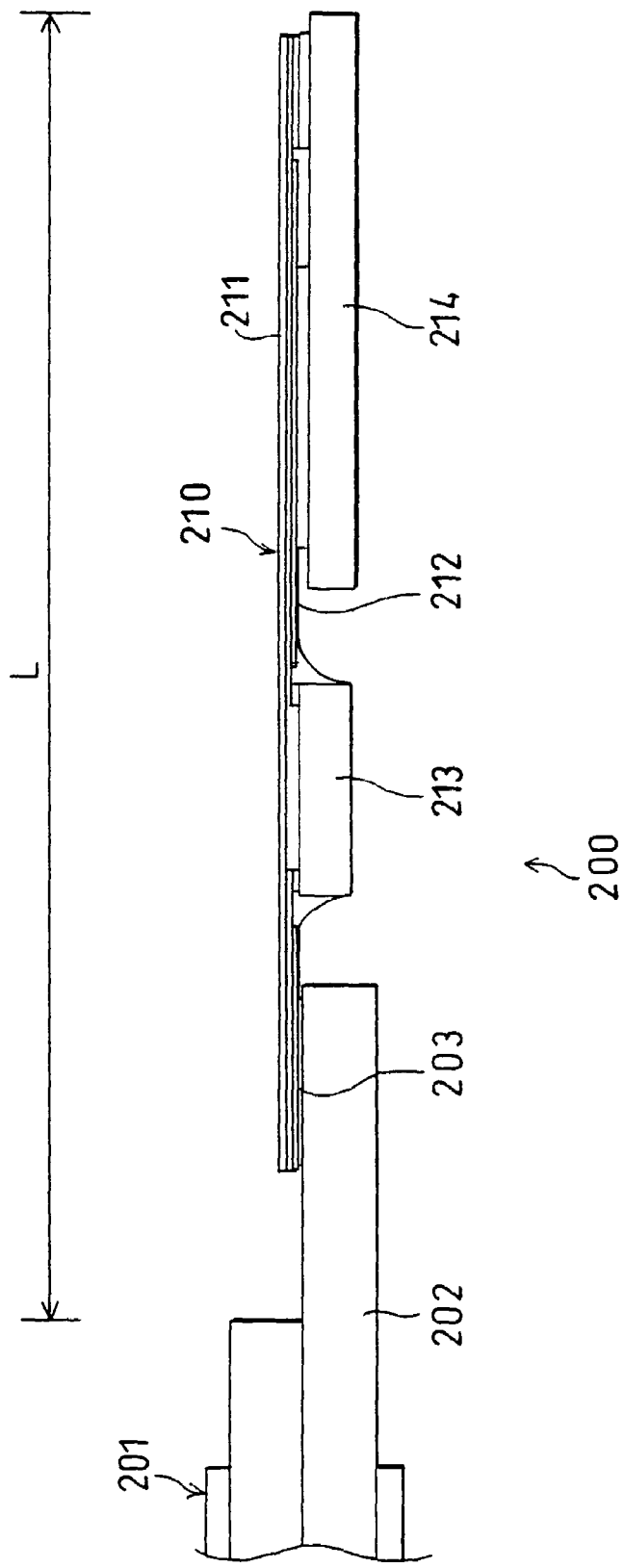
FIG. 12 is a cross-sectional view illustrating a liquid crystal module wherein a conventional semiconductor device, a liquid crystal panel and a printed wiring substrate are mounted in flat.

Next, as illustrated in FIG. 10(c), the end portion of the flexible substrate 3 is folded in U-shape about the end portion of the spacer 22 and is then fixed. As a result, the process of connecting the liquid crystal panel 40 and the semiconductor device 2 is completed.

As described, in the manufacturing methods of the liquid crystal modules 1 and 30 in accordance with the present embodiment, first, the end portion in the film-like flexible substrate 3 having formed thereon the conductor pattern 4 is slightly bent to the back surface side, and then, the liquid crystal panel 40 is connected to the conductor pattern 4 of the flexible substrate 3. Next, after bonding the spacer 22 to the back surface of the flexible substrate 3, the process of fixing the spacer 22 by folding the flexible substrate 3 down to the back surface side in substantially U-shape is performed.

As a result, in the connection process of connecting the flexible substrate 3 of the semiconductor device 2 and the liquid crystal panel 40, the flexible substrate 3 can be folded without having a stress applied to the folded part 7 when pressuring under an applied heat, and thus a problem of cutting off the conductor pattern 4 can be prevented.

As a result, the method of manufacturing the liquid crystal modules 1 and 30 of thinner or shorter structure can be realized.

The semiconductor device of the present invention wherein a semiconductor element is mounted on a surface of a film-like flexible substrate which has formed thereon a wiring pattern and which is provided with external connection terminals at both end portions may be arranged such that a U-shaped folded part which is folded down to a back surface of the flexible substrate is formed in a fixed state at least at one end portion of the flexible substrate so that the external connection terminals of the semiconductor device are connected to the member to be connected in such a manner that the external connection terminals face the member to be connected.

According to the present invention, the semiconductor device is COF (Chip-ON-Film) mounted.

In the present invention, the external connection terminals are connected to the member to be connected provided on the side of the semiconductor element of the semiconductor device in such a manner that the external connection terminals face the member to be connected. Namely, for example, in the case where the member to be connected is a liquid crystal panel, the semiconductor device and the liquid crystal panel are provided so as to face one another.

According to the foregoing structure, the U-shaped folded part which is folded down to the back surface of the flexible substrate is formed in a fixed state at least at one of the end portions of the flexible substrate. Therefore, as will be described later, by providing the flexible substrate so as to have a cross section of substantially S-shape in the module main body, the external connection terminals can be connected to the member to be connected provided on the side of the semiconductor element of the semiconductor device.

In the foregoing structure, it is possible to provide the semiconductor element so as to face the inside of the module, without providing the semiconductor element so as to be projected to the outside.

According to the foregoing structure, in the structure wherein the semiconductor device and the member to be connected are provided so as to face one another, a semiconductor device of a thinner structure can be realized.

The semiconductor device of the present invention wherein a semiconductor element is mounted on a surface of a film-like flexible substrate which has formed thereon a wiring pattern and which is provided with external connection terminals at both end portions may be arranged such that U-shaped folded parts which are folded down to a back surface of the flexible substrate are formed in a fixed state at both end portions of the flexible substrate, so that the semiconductor device, the member to be connected and the printed wiring substrate can be mounted in flat on the back surface side of the semiconductor element of the semiconductor device.

According to the present invention, the semiconductor device is COF (Chip-ON-Film) mounted.

According to the present invention, the semiconductor device, the member to be connected and the printed wiring substrate are mounted on the back surface side of the semiconductor element of the semiconductor device in flat. Namely, for example, in the case where the member to be connected is a liquid crystal panel, the surface of the lower glass substrate of the liquid crystal panel and the wiring pattern of the flexible substrate are mounted facing down. Further, the printed wiring substrate is formed on the back surface side of the semiconductor element.

According to the foregoing structure of the present invention, the U-shaped folded parts which are folded down to the back surface of the flexible substrate are formed in a fixed state at both end portions of the flexible substrate. Therefore, such connected structure that the semiconductor element is provided in the upper side and the lower glass substrate of the liquid crystal panel and the printed wiring substrate are provided in the lower side can be achieved.

According to this structure, the semiconductor element is not provided between the lower glass substrate of the liquid crystal panel and the printed wiring substrate, and thus the overall length of the semiconductor element can be reduced for the length of the semiconductor element.

As a result, in the structure wherein the semiconductor device, the member to be connected and the printed wiring substrate are mounted in flat, the semiconductor device of a shorter structure can be realized.

The semiconductor device of the foregoing structure may be arranged such that a spacer is provided within the U-shaped structure of the folded part for maintaining the folded structure.

According to the foregoing structure, the folded structure can be fixed by the spacer provided in the U-shaped structure of the folded part.

Therefore, the folded structure can be maintained, and thus the external connection terminal can be prevented from being cut off, thereby providing a quality semiconductor device.

The semiconductor device of the foregoing structure may be arranged such that the spacer is an adhesive tape or an adhesive agent.

According to the foregoing structure, the spacer functions as the adhesive tape or adhesive agent, and the folded structure can be fixed with ease.

The semiconductor device of the present invention may be arranged such that the flexible substrate is made of polyimide resin, and the thickness of the flexible substrate is selected to be a thickness of not more than 40 μm.

According to the foregoing structure, when adopting the flexible substrate made of polyimide series resin, by selecting the thickness to be not more than 40 μm, it is possible to fold the flexible substrate in U-shape with ease.

The liquid crystal module of the present invention is arranged such that one of the external connection terminals in the semiconductor device of the foregoing structure is connected to the liquid crystal panel as a member to be connected, while the other external connection terminal is connected to the printed wiring substrate.

According to the foregoing structure of the liquid crystal module, one of the external connection terminals of the semiconductor device is connected to the liquid crystal panel (member to be connected). Further, the other external connection terminal is connected to the liquid crystal panel (member to be connected). As a result, the liquid crystal module can be realized by adopting the semiconductor device in which folded parts which are folded down to the back surface are formed at both end portions of the flexible substrate.

As a result, the liquid crystal module of a thinner or shorter structure can be realized.

The liquid crystal module having the foregoing structure may be arranged such that the flexible substrate is provided so as to have a cross section of substantially S-shape in the inside of the module main body.

For example, in the liquid crystal module wherein the semiconductor device and the liquid crystal panel are provided so as to face one another, in order to realize the semiconductor device of a thinner structure, it is preferable that the external connection terminals of the flexible substrate be connected to the liquid crystal panel in such a manner that the semiconductor element of the semiconductor device faces the inside of the module main body.

In this regard, with the structure of the present invention, since the flexible substrate is provided so as to have a cross section of substantially S-shape in the inside of the module main body, the semiconductor device can be connected to the liquid crystal panel in the above state with ease.

As a result, the liquid crystal module of a thinner structure can be achieved with ease.

The liquid crystal module of the present invention having the foregoing structure may be arranged such that the lighting means is provided between the liquid crystal panel and the flexible substrate, and that the semiconductor element mounted on the flexible substrate is provided so as to face the inside of the module main body.

According to the present invention, the lighting means is provided between the liquid crystal panel and the flexible substrate, and the semiconductor element mounted on the flexible substrate is provided so as to face the inside of the module main body. Thus, the thickness of the liquid crystal module adopting the lighting means can be surely reduced.

The liquid crystal module of the present invention is arranged such that the semiconductor device, the liquid crystal panel and the printed wiring substrate are mounted in flat.

According to the foregoing structure, the semiconductor device, the liquid crystal panel and the printed wiring substrate are mounted in flat; namely, these members are mounted on a plane. Therefore, it is possible to connect the semiconductor device having a U-shaped folded part, which is folded down to the back surface, formed at least at one end portion of the flexible substrate, to the liquid crystal panel without having the semiconductor element between the liquid crystal panel and the printed wiring substrate.

As a result, the liquid crystal module of a shorter structure can be achieved.

The method of manufacturing a liquid crystal module of the present invention is arranged so as to include the steps of:

i) after bonding a spacer to a back surface of an end portion of a film-like flexible substrate having a wiring pattern formed on a surface thereof, folding down the end portion to the back surface side of the flexible substrate in substantially U-shape and fixing the resulting folded end portion to the spacer; and ii) after the step i), connecting external connection terminals of the flexible substrate to a liquid crystal panel or a printed wiring substrate.

According to the foregoing manufacturing method of the present invention, when manufacturing the liquid crystal module, the process of fixing the end portion of the film-shaped flexible substrate having the wiring pattern formed on the surface, which is folded down in substantially U-shape to the back surface side of the flexible substrate after fixing the spacer to the back surface of the end portion of the flexible substrate. Then, the connection process of connecting the external connection terminals of the flexible substrate to the liquid crystal panel or the printed wiring substrate is performed.

In the above method, since the U-shaped folded section fixed by the spacer is formed beforehand in the semiconductor device, when connecting the liquid crystal panel or the printed wiring substrate to the semiconductor device, it is possible to connect the semiconductor device and the liquid crystal panel or the printed wiring substrate using a generally used connection device such as a bonding tool, etc.

As a result, the manufacturing method which provides a liquid crystal module of a thinner or shorter structure can be achieved by preventing an increase in cost.

The method of manufacturing a liquid crystal module of the present invention is arranged so as to include the steps of:

i) after slightly folding down an end portion of a film-like flexible substrate having formed thereon a wiring pattern to a back surface side, connecting external connection terminals of the flexible substrate to the liquid crystal panel or the printed wiring substrate; and ii) after the step i), fixing the end portion of the flexible substrate to a spacer by folding down the end portion in substantially U-shape to the back surface side after bonding the spacer to the back surface of the end portion of the flexible substrate.

According to the foregoing manufacturing method of a liquid crystal module, first, after slightly folding down the end portion of the film-like flexible substrate having formed thereon a wiring pattern to the back surface side, the connection process of connecting the external connection terminals of the flexible substrate to the liquid crystal panel or the printed wiring substrate is performed. Then, after bonding the spacer to the back surface of the end portion of the flexible substrate, the fixing process is performed for fixing the flexible substrate to the spacer by folding it down to the back surface side in substantially U-shape.

According to the foregoing method, when connecting the flexible substrate of the semiconductor device to the liquid crystal panel or printed wiring substrate, the flexible substrate can be folded without having stress applied onto the folded part when pressuring under an applied heat. As a result, such problem that an external connection terminal becomes disconnected can be prevented.

As a result, the manufacturing of a liquid crystal module which provides a liquid crystal module of a thinner or shorter structure while ensuring quality can be achieved.

The liquid crystal module of the present invention is arranged so as to include a semiconductor device wherein a semiconductor element is provided on a surface side of a film-like flexible substrate which has a wiring pattern formed on the surface thereof and which is provided with external connection terminals at both end portions, and a folded part which is folded down to a back surface side of the flexible substrate is formed in a fixed state at least at one end portion of the flexible substrate; and that the semiconductor element is connected to a liquid crystal panel in such a manner that the semiconductor element faces the liquid crystal panel (member to be connected).

According to the foregoing structure, the semiconductor element is provided on the side of the liquid crystal panel, i.e., in the inside of the liquid crystal module. Therefore, it is possible to mount a semiconductor element without adopting such undesirable arrangement that the semiconductor element (projected part) on the flexible substrate is projected to the outside of the liquid crystal module can be avoided, thereby realizing a liquid crystal module of a thinner structure.

The electric equipment provided with the liquid crystal module of the present invention is arranged so as to include a semiconductor device wherein a semiconductor element is mounted on a surface side of a film-like flexible substrate which has a wiring pattern formed on a surface thereof, and which is provided with external connection terminals at both end portions, and a folded part which is folded down to a back surface side of the flexible substrate is formed in a fixed state at least at one end portion of the flexible substrate; and that the semiconductor element is connected to a liquid crystal panel as a member to be connected, while the other external connection terminal is connected to the printed wiring substrate.

According to the foregoing structure, a liquid crystal module of a thinner structure can be realized, thereby achieving a compact size electric equipment.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations, provided such variations do not depart from the spirit of the present invention or exceed the scope of the patent claims set forth below.

What is claimed is:

1. A liquid crystal module, comprising:
    a semiconductor device;
    a liquid crystal panel as a member to be connected; and
    a printed wiring substrate;
    wherein said semiconductor device includes:
        a film-like flexible substrate having formed thereon a wiring pattern;
        external connection terminals formed at both end portions of said flexible substrate; and
        a semiconductor element mounted on a surface side of said flexible substrate,
        wherein at least one end portion of said flexible substrate is folded almost in contact with a back surface of said flexible substrate, so that a flat portion is formed at said at least one end portion, the flat portion having one of the external connection terminals;
    wherein said end portion of said flexible substrate is not in contact with said back surface of said flexible substrate;
    wherein one of said external connection terminals of said external of said semiconductor device is connected oto said liquid crystal panel, while another of said external connection terminals is connected to said printed wiring substrate; and
    wherein the semiconductor element is mounted with its surface facing down.

2. The liquid crystal module as set forth in claim 1, wherein:
    said flexible substrate is provided so as to have a cross section of substantially S-shape in an inside of a module main body.

3. The liquid crystal module as set forth in claim 2, further comprising:
    lighting means provided between said liquid crystal panel and said flexible substrate,
    wherein said semiconductor element mounted on said flexible substrate is provided so as to face inside of said module main body.

4. A liquid crystal module, comprising:
    a semiconductor device, a liquid crystal panel, and a printer wiring substrate which are mounted in flat,
    wherein said semiconductor device includes:
        a film-like flexible substrate having formed thereon a wiring pattern;
        external connection terminals formed at both end portions of said flexible substrate; and
        a semiconductor element mounted on a surface side of said flexible substrate,
    wherein a folded part, which is folded down in U-shape to a back surface side of said flexible substrate, is formed in a fixed state at least one end portion of said flexible substrate; and
    wherein said semiconductor device, said liquid crystal panel, and said printed wiring substrate are substantially in a plane, such that said semiconductor device and said printed wiring substrate are beside said liquid crystal panel.

5. The liquid crystal module as set forth in claim 1, further comprising a spacer positioned between said end portion of said flexible substrate and said back surface of said flexible substrate.

6. The liquid crystal module as set forth in claim 4, further comprising a spacer positioned between said folded part of said flexible substrate and said back surface side of said flexible substrate.

7. The liquid crystal module as set forth in claim 4, wherein said folded part of said flexible substrate is not in contact with said back surface side of said flexible substrate.

* * * * *